(12) United States Patent
Abbott

(10) Patent No.: US 6,180,999 B1
(45) Date of Patent: Jan. 30, 2001

(54) LEAD-FREE AND CYANIDE-FREE PLATING FINISH FOR SEMICONDUCTOR LEAD FRAMES

(75) Inventor: Donald C. Abbott, Norton, MA (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/141,505

(22) Filed: Aug. 28, 1998

Related U.S. Application Data

(60) Provisional application No. 60/057,405, filed on Aug. 29, 1997.

(51) Int. Cl.$^7$ ............... H01L 23/495; H01L 23/48; H01L 23/52; H01L 29/40; H01L 23/28
(52) U.S. Cl. ............... 257/666; 257/696; 257/698; 257/677; 257/762; 257/766; 257/768; 257/769
(58) Field of Search ............... 257/666, 668, 257/677, 698, 762, 766, 769, 748

(56) References Cited

U.S. PATENT DOCUMENTS

| | | | |
|---|---|---|---|
| 5,221,859 | * | 6/1993 | Kobayashi et al. ............... 267/676 |
| 5,360,991 | * | 11/1994 | Abys et al. ............... 257/666 |
| 5,436,082 | * | 7/1995 | Mathew ............... 257/666 |
| 5,486,721 | * | 1/1996 | Herkletz et al. ............... 257/666 |
| 5,650,661 | * | 7/1997 | Mathew ............... 257/677 |
| 5,650,663 | * | 7/1997 | Parthasarathi et al. ............... 257/675 |
| 5,675,177 | * | 10/1997 | Abys et al. ............... 257/666 |
| 5,710,456 | * | 1/1998 | Abbott et al. ............... 257/677 |
| 5,767,574 | * | 6/1998 | Kim et al. ............... 257/677 |
| 5,801,434 | * | 9/1998 | Serizawa ............... 257/677 |

\* cited by examiner

*Primary Examiner*—Alexander O. Williams
(74) *Attorney, Agent, or Firm*—Wade James Brady III; Frederick J. Telecky, Jr.

(57) ABSTRACT

A lead frame lead and method of fabrication of the leadframe. A leadframe is formed from one of copper or copper-based material having a layer of an alloy of palladium and nickel and a coating of palladium formed over the alloy on the leadframe. The coating of palladium is from about 3 to about 10 microinches and preferably about 3 microinches. The palladium/nickel layer is from about 10 to about 40 microinches and preferably about 10 microinches and is an alloy having from about 40 to about 90 percent by weight nickel and the remainder essentially palladium. A preferred ratio is 75 percent by weight nickel and 25 percent by weight palladium. A semiconductor device is fabricated by providing a copper or copper-based leadframe and forming a layer of the palladium/nickel alloy over the entire leadframe followed by a palladium layer thereover while maintaining the assembly temperature below about 180 degrees C during subsequent device assembly.

12 Claims, 1 Drawing Sheet

LEAD-FREE AND CYANIDE-FREE PLATING FINISH FOR SEMICONDUCTOR LEAD FRAMES

This application claims priority under 35 USC § 119(e)(1) of provisional application Ser. No. 60/057,405 filed Aug. 29, 1997.

CROSS REFERENCE TO RELATED APPLICATIONS

This invention is related to Ser. No. 08/190,729 and Ser. No. 08/485,077, the contents of which are incorporated herein in their entirety.

BACKGROUND OF THE INVENTION

1. Field of the Invention

This invention relates to leadframes and methods of fabrication of such leadframes.

2. Brief Description of the Prior Art

In the fabrication of semiconductor devices, semiconductor integrated circuit chips are generally secured to leadframes with bond pads on the chips being coupled to inner lead fingers of the leadframe by way of gold wires. The leadframes make the electrical connection of the integrated circuit to the circuit board possible. To accomplish this purpose, the leadframes provide gold wire bondable inner lead surfaces to allow connection of the gold wire from the integrated circuit bond pad to the leadframe inner lead by bonding, as well as a flat surface to which the integrated circuit chip is attached. The chip inner leads with wire bonds are then encapsulated in plastic and the external leads, which remain external to the plastic encapsulation, must then be solderable to the printed circuit board surface, typically using a solder paste.

In the prior art, the external leads, after encapsulation of the chip and internal leads with gold wires, have been either dipped in molten solder, which is generally an alloy of tin and lead, or plated with the tin/lead solder to preserve the solderability of the external leads. The internal lead tips has been silver spot plated during leadframe manufacture prior to chip attach. A lead finish was thereafter introduced into the art based upon nickel and palladium which eliminated the use of solder and consequently the lead and tin contained in the solder from the leadframe. It also eliminates the silver spot plating of the internal leads. All plating is provided by the leadframe manufacturer, so there is no need for plating at the assembly site. This has proven over time to be a stable and robust lead finish with demonstrable benefits. The drawback to this system is that the nickel layer is generally thick, being on the order of 40 to 120 microinches, to prevent copper diffusion from the base metal to the surface, nickel is a target, albeit of lower importance than lead, of environmental concern. The deposition of nickel is also time consuming and requires rather extensive and expensive waste treatment facilities. It is therefore apparent that elimination or reduction of the nickel and/or replacement of the nickel with a more environmentally and/or economically friendly material is highly desirable.

SUMMARY OF THE INVENTION

In accordance with the present invention, the above described problems of the prior art are minimized.

Briefly, a lead finish and fabrication technique is provided which drastically reduces the amount of nickel deposited on the leadframe. The lead finish takes the form of palladium plated onto a palladium/nickel alloy which has been plated onto a copper base metal leadframe. The layer of palladium/nickel alloy is from about 40 percent to about 90 percent by weight nickel with the remainder palladium and preferably about 75 percent nickel and 25 percent palladium by weight and has a thickness of from about 10 to about 40 microinches and preferably about 10 microinches. This is a substantial reduction in nickel content compared with the prior art which generally requires a nickel layer of from about 40 to about 120 microinches in the nickel/palladium plating system. The leadframe and method in accordance with the present invention takes advantage of the lower temperatures now available during integrated circuit fabrication and assembly which translates into lower copper diffusion rates. This allows for the use of the thinner nickel layer to provide the same prevention against migration of copper to the palladium layer. The present invention operates efficiently when temperatures of the lead frame are held below about 180 degrees C or when heating is localized to the wire bonding area.

Before encapsulation of the integrated circuit chip, the leadframe, which is copper or copper based material, is initially placed in a plating bath having complexed palladium ions and complexed nickel ions in the ratio desired and a coating is provided with the combination of palladium and nickel having a thickness of from about 10 to about 40 microinches and preferably about 10 microinches. The leadframe is then placed in a bath containing palladium ions and plated until the palladium layer over the combined palladium/nickel layer is from about 3 microinches to about 10 microinches and preferably about 3 microinches. The palladium/nickel layer acts as a barrier to the migration of the copper into the palladium layer. However, such copper migration is greatly reduced when a sufficiently low time/temperature function is provided in assembly of the device being fabricated after the palladium coated copper leadframe has been formed. After assembly, the device is now ready for attachment by soldering to a printed circuit board or the like.

The advantages derived from the above described procedure are, initially, the elimination of about 75 to about 90 percent of the nickel from the fabrication process, thereby eliminating the waste treatment costs associated with nickel as well as the plating equipment required for nickel plating. This simplifies the plating process as well as the plating process control over that of the prior art and thereby increases the plating throughput. This greatly eliminates the relatively high costs associated with nickel plating. In addition, no silver is required, thereby eliminating the potential for dendritic growth caused by silver. Also, use is made of the low porosity of the nickel/palladium alloy plating to prevent copper diffusion with the greatly reduced nickel requirement. The plating time for the prior art 40 to 120 microinches of nickel is about 40 seconds whereas the time required to plate the nickel/palladium alloy in accordance with the present invention is about 8 seconds. In addition, the plating line required to plate the nickel is on the order of 20 feet whereas the line required for plating the palladium/nickel alloy is about 4 feet. Still further, the problem of thick nickel cracking and orange-peeling during the lead formation operation is eliminated.

DESCRIPTION OF THE PREFERRED EMBODIMENT

Figure 1:
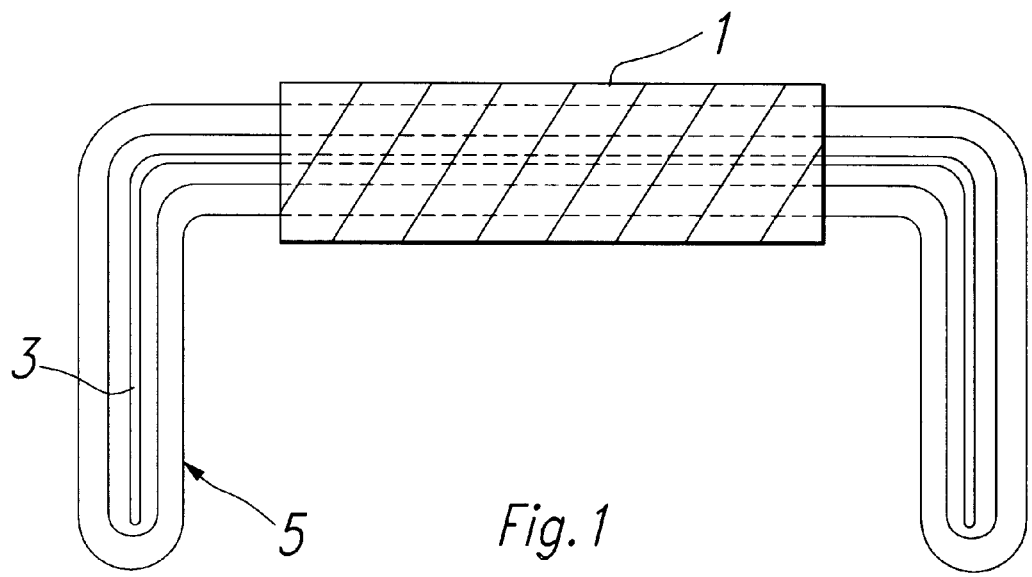
FIG. 1 is a schematic diagram of a fabricated semiconductor device with the external leads of the leadframe extending from the package containing the chip.

Referring to FIG. 1, there is shown a standard semiconductor package which includes an encapsulated chip portion 1 and leads 3 which extend from the leadframe within the package in standard manner. The terminal portions of the leads 3 are coated with a coating 5 which is a palladium/nickel layer followed by a palladium layer.

Figure 2:
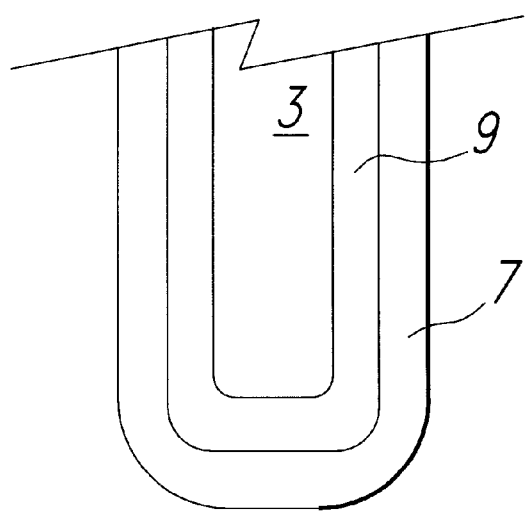
FIG. 2 is an enlarged view of the coated end portion of a lead of FIG. 1.

The lead coating or finish 5, as shown in FIG. 2, takes the form of palladium 7 plated onto a palladium/nickel alloy layer 9 which has been plated onto a copper base metal leadframe 3. The palladium/nickel alloy layer 9 has about 25 percent by weight palladium and about 75 percent by weight nickel. The leadframe is then placed in a palladium ion-containing bath and a 3 microinch layer of palladium is deposited over the palladium/nickel layer. The device assembly technique preferably requires that the assembly temperature/time function be sufficiently low subsequent to the deposition of the palladium layer to avoid the diffusion of copper from the leadframe leads 3 into the palladium layer formed thereover, this temperature being below about 180 degrees C.

Though the invention has been described with respect to specific preferred embodiments thereof, many variations and modification will immediately become apparent to those skilled in the art. It is therefore the intention that the appended claims be interpreted as broadly as possible in view of the prior art to include all such variations and modifications.

What is claimed is:

1. A leadframe lead system which comprises:
   (a) a copper or copper-based material leadframe;
   (b) a layer of an alloy of palladium and nickel disposed directly on said leadframe; and
   (c) a coating of palladium disposed over said layer of an alloy on said leadframe.

2. The leadframe of claim 1 wherein said coating of palladium is from about 3 to about 10 microinches.

3. The leadframe of claim 1 wherein said coating of palladium is about 3 microinches.

4. The leadframe of claim 1 wherein the palladium/nickel layer is from about 40 percent by weight to about 90 percent by weight nickel and the remainder palladium.

5. The leadframe of claim 2 wherein the palladium/nickel layer is from about 40 percent by weight to about 90 percent by weight nickel and the remainder palladium.

6. The leadframe of claim 3 wherein the palladium/nickel layer is from about 40 percent by weight to about 90 percent by weight nickel and the remainder palladium.

7. The leadframe of claim 4 wherein said palladium/nickel layer has a thickness of from about 10 to about 40 microinches.

8. The leadframe of claim 5 wherein said palladium/nickel layer has a thickness of from about 10 to about 40 microinches.

9. The leadframe of claim 6 wherein said palladium/nickel layer has a thickness of from about 10 to about 40 microinches.

10. The leadframe of claim 4 wherein the palladium/nickel layer is about 10 microinches.

11. The leadframe of claim 5 wherein the palladium/nickel layer is about 10 microinches.

12. The leadframe of claim 6 wherein the palladium/nickel layer is about 10 microinches.

* * * * *